US009281186B2

(12) United States Patent
Wootton

(10) Patent No.: US 9,281,186 B2
(45) Date of Patent: Mar. 8, 2016

(54) COLORED PHOTOVOLTAIC MODULES AND METHODS OF CONSTRUCTION

(75) Inventor: Gerald R. Wootton, Cambridge (CA)

(73) Assignee: ATS AUTOMATION TOOLING SYSTEMS INC., Cambridge, Ontario (CA)

( * ) Notice: Subject to any disclaimer, the term of this patent is extended or adjusted under 35 U.S.C. 154(b) by 298 days.

(21) Appl. No.: 13/437,378

(22) Filed: Apr. 2, 2012

(65) Prior Publication Data

US 2012/0247541 A1 Oct. 4, 2012

Related U.S. Application Data

(60) Provisional application No. 61/470,422, filed on Mar. 31, 2011.

(51) Int. Cl.
*H01L 31/044* (2014.01)
*H01L 21/02* (2006.01)
*H01L 31/02* (2006.01)
*H01L 31/048* (2014.01)
*H01L 31/055* (2014.01)

(52) U.S. Cl.
CPC ...... *H01L 21/02535* (2013.01); *H01L 21/0262* (2013.01); *H01L 21/02532* (2013.01); *H01L 31/02* (2013.01); *H01L 31/048* (2013.01); *H01L 31/055* (2013.01); *Y02E 10/52* (2013.01)

(58) Field of Classification Search
CPC ........ H01L 31/00–31/208; Y02E 10/50–10/60
USPC .................................. 136/243–265
See application file for complete search history.

(56) References Cited

U.S. PATENT DOCUMENTS

2007/0068571 A1 3/2007 Li et al.
2008/0006323 A1* 1/2008 Kalkanoglu et al. .......... 136/253
2009/0044861 A1* 2/2009 Debije et al. .................. 136/259

FOREIGN PATENT DOCUMENTS

EP 2 051 124 A2 4/2009
WO 2008/137966 A2 11/2008

OTHER PUBLICATIONS

Devenport et al., "Process Optimisation for Coloured Laser Grooved Buried Contact Solar Cells", IEEE Photovoltaic Specialists Conference, San Diego, California, U.S.A., May 11-16, 2008, E-ISBN : 978-1-4244-1641-7, pp. 1-4.
Ishikawa et al., "PV Modules, Using Color Solar Cells, Designed for Building", IEEE Photovoltaic Specialists Conference, Waikoloa, Hawaii, U.S.A., Dec. 5-9, 1994, vol. 1, pp. 977-980.
International Search Report dated Jun. 1, 2012, International Patent Application No. PCT/CA2012/050209.

* cited by examiner

*Primary Examiner* — Bach Dinh
(74) *Attorney, Agent, or Firm* — Gowling Lafleur Henderson LLP; Neil Henderson

(57) ABSTRACT

A colored photovoltaic module and method for its production, where the module includes: a photovoltaic cell; and an appearance modifying film, encapsulant or glazing; where the appearance modifying film, encapsulant or glazing includes: a light-control film; graphic material; a phosphor; a dichroic film; nano-particles; micro-dots; metal flakes; paint; an additive material for 3-D printing, Selective Laser Augmentation (SLA) or Selective Laser Sintering (SLS); or any combination thereof.

10 Claims, 7 Drawing Sheets

COLORED PHOTOVOLTAIC MODULES AND METHODS OF CONSTRUCTION

CROSS REFERENCE TO RELATED APPLICATIONS

This application claims the benefit of priority of U.S. Provisional Patent Application No. 61/470,422 filed Mar. 31, 2011, which is incorporated herein by reference in its entirety.

FIELD

This application generally relates to colored photovoltaic (PV) modules and methods of their construction.

BACKGROUND

The esthetics of photovoltaic cells and modules (sometimes referred to as "PV") have been largely ignored. This has begun to change with the development of building-integrated photovoltaic (BIPV) applications (as opposed to building-mounted PV applications. Although BIPV may make sense in a modern context, attractiveness and/or poor esthetics limit the acceptance of BIPV. In some cases, PV has encountered zoning constraints on the basis of appearance or color.

BIPV has an intrinsic advantage over building-mounted PV since the glazing and mounting structures, as well as the majority of the installation labor, is already accounted for in the cost of construction, thereby lowering the overall cost of the produced solar power. Wiring used to collect power from PV modules can be interior wiring rather than outdoor wiring, which can also reduce associated costs of the PV system. These are major advantages for building-integrated PV, as opposed to building-mounted PV.

Conventional solar modules may be produced as a laminate subassembly to which framing and interconnection elements may be added. Briefly, this laminate subassembly comprises a front glazing, an encapsulant layer, an array of cells with interconnections, a second encapsulant layer and a backsheet. The encapsulant layers are used to bond the laminate subassembly together but also serve the purpose of optically coupling the cells to the glazing. The backsheet primarily provides protection for the array of cells but is also visible through any gaps in the cell array. The various elements of the laminate subassembly may be stacked in a process commonly known as "layup", with the entire subassembly bonded together in a press in a process commonly called "lamination". The basic components of the layup may be simple or complex; for example, the glazing may have been treated in order to reduce its reflectance or otherwise improve its performance while the backsheet may be a polymer laminate with enhanced mechanical and moisture blocking properties. Encapsulant is commonly supplied as a film which is cut into sheets and placed onto the stack but may also be a fluid material which is applied as a coating during the layup process.

A PV module known in the art comprises active regions which are the photosensitive portions of the cells, inactive regions which comprise most of the other portions of the module (such as framing and marginal regions in and around the array of cells) and semi-active regions (such as metal interconnects and backsheet areas close to the cells) which are able to redirect a portion of incident light onto active areas by double reflection. The visual appearance of a PV module is determined by these features, with the active areas appearing relatively dark—preferably very dark if the majority of incident light is absorbed—and metallic areas appearing relatively bright. Visible portions of the backsheet depend on the material which could be transparent, particularly if glass, or white, for maximum module efficiency, or black if an overall dark appearance is desired.

A monolithic thin film PV module known in the art may be constructed in a somewhat different fashion since the cell array is generally deposited and formed directly onto the glazing which simplifies layup and lamination and eliminates one layer of encapsulant. Typically, the exposed interconnections are formed from a transparent conductor and the gaps between cells are quite small; consequently, the visual appearance is largely determined by the active area of the cells. This presents a somewhat different problem set if it is desirable to alter the visual appearance of a monolithic thin film PV module. In some other cases, the thin film cell array may have been formed on the backsheet, in which case, the encapsulant layer also optically couples the cells to the glazing. In this instance, the front contacts of the cells may be transparent or metallic.

Glass is a popular material for building facades due to its weather resistance, durability and light weight. Since it is basically transparent, a variety of methods can be used to change its appearance through the application of colorants, coatings and backdrops. Also, glass can be given variable textures during the manufacturing process at very little cost. Glass curtain wall construction is increasingly popular for commercial construction since it can withstand the weathering process. Glass curtain wall construction can integrate with window glazing in the same building skin. Compared to precast concrete, granite, marble, and other building materials, glass curtain wall construction is lighter, provides reduced wind resistance and lower precipitation loads. While sheet metal skins, in some cases, can be lighter than glass, the durability of glass is generally superior. Polymer glazing is also gaining acceptance as it can exhibit impact resistance and is typically still lower weight.

When glazing is applied in commercial construction and high rise construction it may be required to include a safety glass laminate that includes more than one layer of glazing bonded to/by an internal polymer layer. Since solar modules may have a glass surface or other glazing, they can be used as a finishing material for building facades and roofing where other hard surface materials might be used. Even though building integrated mounting may not be ideal for receiving sunlight, the incremental cost of using building integrated solar modules is low compared to applying solar panels separately since glazing, sealing and framing can be responsible for ~40% of the module cost. When both PV glazing and architectural glazing must meet certain requirements for mechanical strength, it is desirable to optimize PV glazing for optical properties in order to increase the efficiency of the PV module. Accordingly, some design compromises may be beneficial.

Also, in locations where efficiency would be poor, dummy panels could be seamlessly integrated. Another advantage of this approach is that racking and installation costs may be avoided and wiring may be moved from outdoor exposure to an interior service chase.

BIPV may be mounted at some elevation relative to street view. In roof-top installations it can also be mounted at an incline, for example on sloped rooftops or in building awnings where panels may be mounted at an incline. The incline of the building awnings may be variable, providing shading and controlling a building's solar gain.

When glass is used for building cladding, particularly at height, much heavier glazing may be required in order to meet building codes and this may have an impact on BIPV module construction.

There have been attempts to change the appearance of solar modules. These approaches have limited efficacy or significantly reduce the module efficiency. Some attempts include:

- use of multi-wire tabs (using a large number of narrow conductors instead of just two or three to interconnect cells) which dilutes the visual appearance of tabbing so that from a distance the reflective metal areas are less apparent (for example, as practiced by Day4 Energy in its "Stay-powerful™ Technology");
- use of structured tabs which recycle reflected light using total internal reflection suppressing the bright reflection of the metal making it visually indistinct (for example, Light Capturing Ribbon from Ulbrich);
- use of black backsheets to make the spaces in the cell array less visible; and
- use of colored backsheets.

The ability to have a colored appearance is touted as a feature of die-sensitized solar cells. Because they are typically a thin film/liquid film, considerable graphical expression is possible. Similarly chalcopyrite cells, e.g. CIS & CIGS, can have the properties of the absorber modified to change the absorption spectrum resulting in a variety of green and earth-tone colors. Modified antireflective (AR) coatings on silicon cells are used to produce a variety of colors ranging from blue to purple, magenta, brown, gold and green.

Existing approaches can provide only very limited solutions. They can make a solar module appear almost uniformly dark or they can render color at the cost of efficiency and, in the case of organic cells, lifetime. Approaches that involve modification of the photoabsorber(s) can be problematic as they can reduce the efficiency of the cells; more importantly, modification of the photoabsorber could include a deviation in the manufacturing recipes that have been tuned for performance, and could impose a requirement for custom cells when module manufacturers tend to buy cells as a commodity. Also, since it is beneficial for all cells in a string to have matched performance, this imposes limits on the graphic possibilities. Many of the colored solar cells currently on offer are essentially attempts to turn deficiency (low efficiency) into an advantage (color).

Specific limitations of some commercially available existing approaches include:

- use of multi-wire or contoured tabs merely makes the module have a more uniform appearance which is a minor benefit relative to esthetics;
- use of a dark backsheet creates a significant (~2%) efficiency penalty (since light reflected by a white back sheet is recycled) with relatively minor benefit unless a uniform black or dark blue appearance is what is desired; and
- use of a colored backsheet can be used to add coloration, however, existing offerings are limited to monochrome background color and conventional cell layups. This method does not alter the appearance of exposed metal conductors.

The above noted previously known methods for changing the appearance of PV modules may be used in combination with the methods disclosed in this application, primarily, because the previously used methods can have relatively little impact on the module appearance.

Another existing approach includes using modified absorber properties, which is generally a proposed virtue for low-performing cell technologies but is the result of limited absorption and/or light trapping. This approach may interfere with the formation of the absorber and may have a disproportionate impact on efficiency as the recipes for creating photoabsorbers may not be amenable to modification.

Still another existing approach includes using a modified antireflective (AR) coating. This approach provides a moderate repertoire of colors but sacrifices efficiency by reducing the effectiveness of the AR coat. However, using a modified AR coating may provide benefits over modifying the photoabsorber. Since the AR coating process is normally also used to passivate the front surface of the photoabsorber, this may have implications for the cell manufacturing process. Finally, this approach requires custom cells. Some cell manufacturers have used this approach successfully to produce colored cells and even cells with patterns while only sacrificing 2-4% efficiency and might be used effectively in combination with the new methods herein.

Limitations of using modified absorber properties and modified AR coatings for changing the appearance of PV modules include:

Die cells and die sensitized cells which are more typically colored than broadly absorbing may have several negative aspects, including reduced efficiency (~4-6% for die cells versus ~15-20% for conventional crystalline silicon PV modules) and reduced lifetime (~2000 hours for die cells versus ~25 years for conventional crystalline silicon PV modules). A significant detractor is that the decline of efficiency in die cells is accompanied by bleaching (loss of color). Also, known approaches may require glass/glass encapsulation, thereby increasing the module weight. Also, die cells may exhibit migration of the die over time when mounted vertically.

Coloration of chalcopyrite cells provides a limited repertoire of colors but at the cost of reduced efficiency. The 'natural' color of these cells tends towards dark brown which, with modifications, can be shifted towards various greens and earth tones. Since the chemistry of these cells is poorly understood and since the typical efficiencies are already significantly less than crystalline silicon modules, it is generally undesirable to modify the deposition process for cosmetic purposes. This approach requires custom cells. These known approaches may also be used in combination with the methods disclosed in this application.

The known approaches for changing the appearance of PV modules include the use of miniature cells or spheral cells in sparse arrays for skylights and glass roofs—where some transparency is required but some shading is also desirable and where color is less important. In this case, module output is reduced but not cell efficiency, thereby resulting in a low capacity cost on a $/W basis. Such modules are limited in their range of applications. This approach could however be combined with the new methods to provide ornamental solar windows.

Accordingly, there is a need for solar modules having coloration and graphics, where the solar modules are intended to be compatible with building construction and photovoltaic module manufacturing practice and without unduly impacting the module efficiency.

SUMMARY

Generally speaking, the embodiments of PV modules in the present application alter at least a portion of the incident light to the observer, as required to create a modified visual appearance.

Solar cells, particularly efficient solar cells, provide a dark backdrop for whatever optical contrivances are used to create a visual effect. In general, it can be assumed that the solar cells will be mounted to the inside of architectural glazing; however, there may be cases where it is desirable to apply solar modules as an exterior finish, for example on siding, roofing and awning.

Modules with modified visual appearance may be advantageously applied as an element of buildings but may also be used in other applications, for example, motor vehicles, boats, fencing, sound barriers, sign boards, etc. Notably, solar roofs are a popular option for motor vehicles where the ability to improve the visual appearance of the solar roof can be very desirable.

In an aspect of the present application, there is provided a coloured photovoltaic module that includes: a photovoltaic cell; and an appearance modifying system that interacts with at least a portion of the incident light on the photovoltaic cell to cause a modified visual appearance to an observer without significant reduction of the efficiency of the photovoltaic cell. The term colored photovoltaic module refers to a module that has a modified visual appearance which includes aspects that are in addition to power generation requirements. Colored photovoltaic modules may include grey scale features and, accordingly, modules that are, for example, grey, black, white or silver are considered to be colored in the context of the current description.

The appearance modifying system may include a film, encapsulant or glazing. The film, encapsulant or glazing may include a pattern configured to alter the visual appearance of the photovoltaic cell.

The appearance modifying system may include: a light-control film; graphic material; a phosphor; a dichroic film; nano-particles; micro-dots; metal flakes; paint; an additive material for 3-D printing, Selective Laser Augmentation (SLA) or Selective Laser Sintering (SLS); or any combination thereof.

The appearance modifying system may demultiplex incident light into a power-creating component and an appearance-modifying component.

The appearance modifying system may interact with at least a portion of the incident light on the photovoltaic cell to divert a portion of the incident light to an observer such that the appearance is altered in comparison to photovoltaic cells without an appearance modifying system.

The appearance modifying system may modify the reflection, photoluminescence, scattering, perspective, optical properties, or any combination thereof of the photovoltaic cell. Modifying the photoluminescence may include modifying the fluorescence, phosphorescence, quantum conversion, or any combination thereof of the photovoltaic cell.

The photovoltaic cell may spatially and/or spectrally demultiplex incident light into a power-creating component and an appearance-modifying component, where the power-creating component is minimally affected using spatial and/or spectral demultiplexing.

The color may be produced by a photoluminescent material and a portion of the light produced by the photoluminescent material may be absorbed by the photovoltaic cell, thereby increasing module efficiency through photon conversion.

The appearance modifying system may be substantially aligned to photovoltaically inactive portions of the photovoltaic module.

The colored photovoltaic module may further include edge lighting for creating an enhanced visual appearance in reduced incident light conditions. The edge light and the appearance modifying system may interact to produce color.

The colored photovoltaic module may further include backlighting for creating an enhanced visual appearance.

The appearance modifying system may direct light selectively towards an observer in one or more relatively narrow spectral bands generally aligned to the peak spectral responses of human vision receptors.

In another aspect of the present application, there is provided a method for producing a coloured photovoltaic cell. The method includes: providing a photovoltatic cell; providing an appearance modifying film, encapsulant or glazing; and laminating the photovoltaic cell and the appearance modifying film, encapsulant or glazing to produce the coloured photovoltaic cell; where the appearance modifying film, encapsulant or glazing includes: a light-control film; a phosphor; a dichroic film; nano-particles; micro-dots; metal flakes; paint; an additive material for 3-D printing, Selective Laser Augmentation (SLA) or Selective Laser Sintering (SLS); or any combination thereof.

The appearance modifying film, encapsulant or glazing may modify the reflection, photoluminescence, scattering, perspective, optical properties, or any combination thereof of the photovoltaic cell. Modifying the photoluminescence may include modifying the fluorescence, phosphorescence, quantum conversion, or any combination thereof.

The appearance modifying film, encapsulant or glazing may be configured to modify the appearance in-line with the assembly of the photovoltaic module.

The appearance modifying film may be a light control film and the orientation of inclusions in the light control film may be optimized at or near the angle of incident light based on latitude and desired power efficiency characteristic. The inclusions may be striations.

In another aspect, there is provided a non-functional coloured photovoltaic (PV) module. The non-functional PV module includes an appearance modifying system, wherein the appearance modifying system interacts with at least a portion of incident light to cause a modified visual appearance to an observer without significant reduction of the efficiency of a photovoltaic cell; and lacks a functional photovoltaic cell.

In another aspect, there is provided a building integrated construction comprising a colored PV module as described above and a non-functional coloured PV module as described above.

In another aspect of the present application, there is provided a method to produce PV modules with modified appearances, the method comprising: modifying an encapsulant and/or modifying a glazing and/or introducing a new layer of material into the lamination stack. The various steps may be applied individually or in combination in order to produce PV cells with modified appearances. Additionally, the steps may be applied in combination with known methods of improving the appearance of solar modules.

The method described herein is based on a few principles:
 reflection, in particular reflection from highly reflective surfaces;
 photoluminescence, for example fluorescence, phosphorescence and quantum conversion;
 scattering;
 perspective;
 optical filters; and
 anti-reflection.

Reflection and scattering may be used to redirect light. Photoluminescence may be advantageous when it is activated by light which is outside the spectral absorption of the PV cells and because the radiated light is intrinsically colored. Various color filters may be applied. Dichroic filters/mirrors may be used to select out some wavelengths of light without absorbing others (resulting in additive, rather than subtractive, coloration).

In an aspect of the present application, there is provided a PV cell which demultiplexes the incident light into components used to create power and components used to modify appearance, in a way that light with PV potential is minimally affected using spatial and/or spectral demultiplexing. Some elements added primarily for visual effect may also be used to improve module efficiency.

For conventional modules, a portion of the module area has low PV potential, such as the areas between cells, areas in the margins and areas occupied by interconnections on the top sides of the cells. This can be exploited through selective patterning methods as described herein. Also, differences between the direction of incident sunlight and the directin from which a typical observer would view the PV module can sometimes be exploited using perspective.

Known solar cells have a limited spectral response, which leaves portions of the solar spectrum poorly utilized or not utilized at all. This can be exploited using photoluminescence methods which, in some cases, improves module performance.

Conventional solar modules are often glossy in appearance, which may be aesthetically problematic but which also implies reduced visual contrast of features within the glazing and reduced efficiency. This can be exploited using anti-reflection methods which, in some situations, improve module performance concurrently with improved appearance.

In an aspect herein, there is provided a process for manufacturing solar modules with modified visual appearance, where the process is a modification of existing PV module manufacturing practice and includes at least one of the following processes:

integration of at least one additional film into a module lamination stack, for example using a modified layup and lamination process;

modification of an encapsulant film, for example modifying the encapsulant film during sheeting or layup process, or modifying liquid encapsulant, for example suing a modified dispensing process;

mechanical modification of the glazing, for example using a modified glazing or modifying glazing during feeding and/or layup processes;

optical modification of the glazing, for example using a modified glazing during feeding and/or layup processes;

post-lamination modification of the laminate subassembly, for example applying additional material to the laminate subassembly (an intermediate formed during module assembly), for example involving additional layup and lamination processes;

modification of the safety glass composition, where safety glass may be required for building panels in high rise installations and may be a laminate with an inner layer between sheets of glazing which provides an opportunity to introduce modifications such as those described herein;

2D and 3D printing, SLA (Selective Laser Augmentation) or SLS (Selective Laser Sintering) to create an optical structure within a PV laminate assembly;

spray painting and powder coating to modify glazing, encapsulant, backsheet and/or cells in preparation for, or during, the layup and/or lamination process; and engraving and embossing to modify glazing encapsulant, backsheet and/or cells in preparation for, or during, the layup and/or lamination process.

In another aspect herein, there is provided a solar module with modified appearances having at least one the following materials:

light-control film;
graphic materials or media (e.g. paint, ink, powder);
fluorescent glazing;
dichroic film;
graphically designed back sheet film;
specially textured glazing; and
additive materials for 3-D printing/SLA methods.

In another aspect herein, there is provided an apparatus for manufacturing a solar module with modified appearances, the apparatus comprising at least one of the following systems:

scanning laser system for selective deposition on glass by SLA, SLS or thermal transfer method;

scanning laser system for selective deposition on glass by LID (Light Induced Deposition) method;

screen printer system for patterning of glazing, encapsulant and/or backsheet;

coater system for modification of an encapsulant film, for example a microjet dispensing system or an ink jet system;

mixer and coater system for modification of a liquid encapsulant; and modified sheet extruder system for light-control films with complex patterns including encapsulant films.

The methods used to produce a PV module with modified appearances are compatible with existing module manufacturing techniques and can be put into practice with minor changes to the module assembly process and reduced impact on overall product design. These methods can be applied to modules composed of standard solar cells. Since the resulting PV modules having modified appearances may consume smaller amounts of incident light than known PV modules having modified appearances, the impact on PV module efficiency is reduced. In some embodiments, the PV modules with modified appearances may use edge lighting, thereby providing night-time visibility.

BRIEF DESCRIPTION OF THE DRAWINGS

The drawings included herewith are for illustrating various examples of methods, processes and apparatuses for producing PV modules with modified appearances, and are not intended to limit the scope of what is taught in any way. In the drawings.

DETAILED DESCRIPTION

Figure 1:
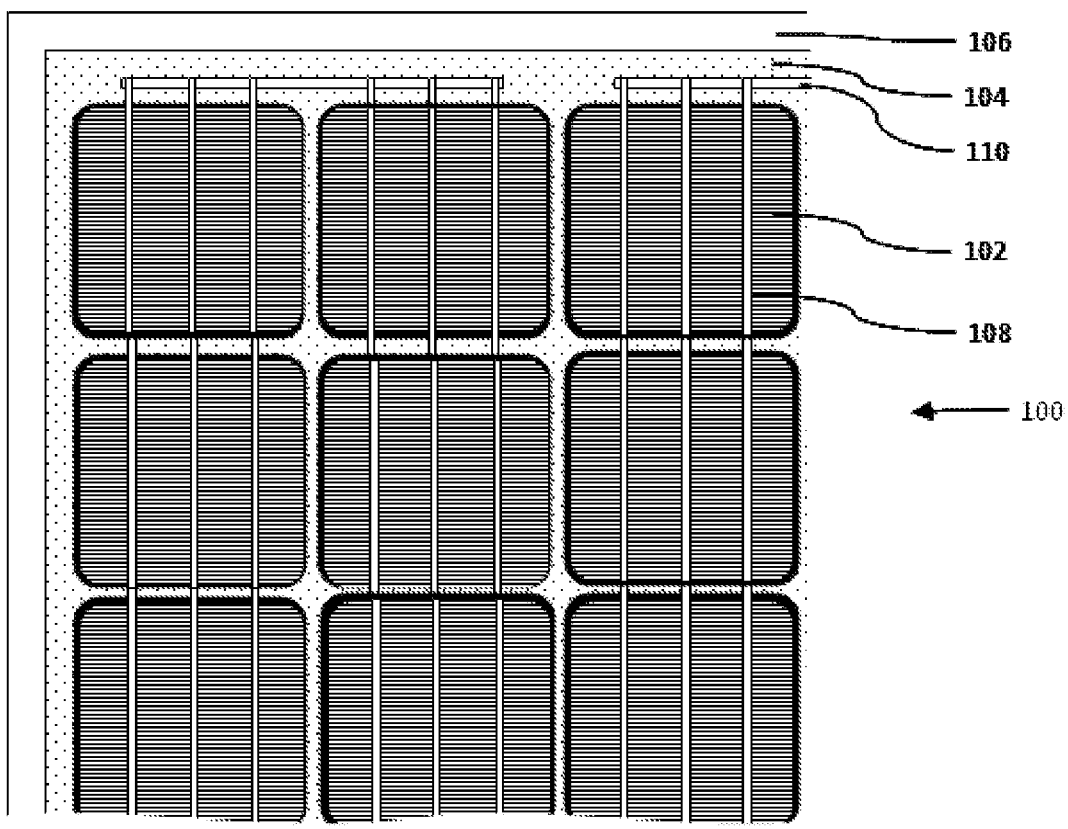
FIG. 1 is a front view illustration of a portion of a solar module.

Numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein.

Furthermore, this description is not to be considered as limiting the scope of the embodiments described herein in any way, but rather as merely describing the implementation of the various embodiments described herein. The embodiments described herein are not intended to be limited to the specific details of any one example embodiment or to specific details that may be common to multiple, or all, example embodiments.

The applicants, inventors or owners reserve all rights that they may have in any embodiments disclosed herein, for example the right to embodiments claimed in a continuing application, and do not intend to abandon, disclaim or dedicate to the public any such embodiments by disclosure of this document.

Glass is a popular material for building facades due to its weather resistance and durability. Since it is basically transparent, a variety of methods can be used to change its appearance through the application of colorants, coatings and backdrops. Also, glass can be given variable textures using rolling dies during the manufacturing process at reduced cost. Glazing materials may also be used to change the appearance of glass. For example, polymer glazing has improved impact strength and reduced weight in comparison to other glazing materials, and may be used in both 'glass' curtain wall construction and solar module manufacturing.

The methods and processes used to produce PV modules with modified appearances can be integrated into conventional solar module assembly processes. PV modules with modified appearances may alternatively be produced as a subassembly and integrated into architectural panels by a glazing manufacturer.

The methods and processes include steps which may be applied individually or in combination. The steps may be applied in combination with known methods for changing the appearance of solar modules.

The methods and processes according to the present application are intended to generate a PV module with modified appearances by: modifying an encapsulant or glazing, or introducing a new layer of material into a lamination stack. Introducing a new layer of material into a lamination stack may additionally involve adding another layer of encapsulant. Reflection and scattering may be used to redirect light.

Photoluminescence may be used and may be activated by light outside the spectral response of the PV cells or at least in parts of the spectrum with weak response. Using light outside of the spectral response of the PV cells can increase efficiency of the PV cells since luminescence that does not escape may be usefully absorbed by the PV cells. It can be desirable to use photoluminescence since the radiated light is intrinsically colored and has one or a few dominant wavelengths which give it color, and no color filtering mechanism is required although broad spectrum and complex luminescence is also an available alternative.

Luminescent materials embedded in the assembly may have a reduced effect, and in some example may have only a minor effect, on the solar spectrum utilized by the PV cells, while redeploying radiation to which they have less sensitivity, and in some examples may have little or no sensitivity. Up-converters, for example materials which would convert light below the band gap of the solar cells (i.e. longer wavelengths) may be used.

Commercially available blue and UV converters are known in the art. Conventional solar cells have poor blue and UV response for a variety of reasons:
  poor short wavelength response being attributable to the 'dead zone' in the structure of crystalline silicon cells or strong absorption in the window layer (e.g. CdS) in chalcopyrite cells; and
  UV can be intentionally suppressed or blocked in the glazing and/or encapsulant in order to avoid its damaging effects.

Consequently, blue and UV light can be considered to be almost 'free' due to its limited utility in generating power. Blue light is still relatively strong in sunlight. UV is weaker and may be problematic as the encapsulant and/or the PV cells could be degraded by UV; furthermore, either the glazing or the first encapsulant or both may be used to block incident UV radiation. If UV converters are used, they could be incorporated in the glazing or at the first surface of the encapsulant so as to take advantage of the UV light but still allowing the glazing and/or encapsulant to suppress or block the UV light. Alternatively, UV sensitive materials may advantageously be used to provide UV protection in addition to modifying the visual appearance. Luminescent materials are candidates for visibility under low light conditions, such as by using edge-lighting the module with an appropriate source, for example blue, infrared or UV LEDs. In this way, a building panel may take on a colored appearance both in daylight and, if desired, in low light conditions (such as at night).

Various color filters may be applied to modify the appearance of PV cells. Color filters may be selectively applied to the highly reflective surfaces of the module in order to change the appearance of these surfaces without affecting the active areas of the cells.

Dichroic filters/mirrors may be used. Such filters/mirrors can operate by selecting out selected wavelengths of light, thereby conveying color more efficiently than pigments which function by absorbing wavelengths of light. One advantage of this approach is that reflectance can be achieved over a relatively narrow spectral band resulting in a strong impression of color while reflecting a small portion of the incident light. Advantageously, dominant wavelengths near the peak response of human eye receptors could be selected to maximize the effect with reduced impact on the efficacy of solar cells with much broader spectral response. Dichroic filter material in the form of films may be used. Such material may be adhered to a surface and flakes, for example in the form of powders or suspensions, may be included in printable inks. Since this material is essentially an interference filter, a preferred planarity provides a predictable color. In the case of flakes, a fluid medium which is evaporated after deposition may be used to level them to the surface on which they are deposited.

The visual appearance of a PV module is produced by directing some portion of the incident light towards an observer. When a spectrally selective principle is applied, a colored appearance results.

Light can be redirected via a reflection which is complementary to the angle of incidence of the incoming light.

However, depending on the desired range of viewing angles, diffuse reflection may be used. Direct sunlight is relatively directional; however, its direction has a substantial variability. Also, the typical line of sight may not be complementary to the typical angle of incidence. This may result in either inefficiency (i.e. wasted redirection of incident light) or lack of colored appearance. Optical/geometric arrangements may additionally be used to produce a desired visual appearance from the perspective of the typical observer. Such optical/geometric arrangements may include:

- texturing to create a more diffuse and/or structured reflection;
- texturing or structure to escape the plane of the module lamination; and/or
- use of perspective to rotate the optimum line of sight.

FIG. 1 is a front view illustration of a portion of a solar module (100). The solar module (100) illustrated in FIG. 1 includes a front contact solar cell (102), a backsheet (104), a module frame (106), tabs (108) and busing (110). The solar cell (102), as illustrated, has a fine metal front contact structure and has a dark appearance.

The back sheet (104) is visible in the spaces between cells and around the perimeter of the array. The back sheet (104) may provide environmental protection and/or electrical isolation for the module. It may be a polymer composite or a glazing material. It may be desirable for the back sheet (104) to be reflective since the light reflected may eventually reach an active part of the PV cells through multiple reflections.

The exposed portions of the back sheet (104) can occupy a relatively large portion of the module area. Although the back sheet (104) may provide some beneficial solar gain, it can be seconded to the purpose of changing visual appearance.

Although illustrated with module frame (106), PV modules may be produced with or without frames. In BIPV applications, other framing may be supplied as part of the construction. In various curtain wall applications, the glass panels may be held in place by edge clips that are concealed by trim strips. In others, glass is held at the edges by structural framing.

The tab (108) is a conductor that is used to interconnect cells from one to the next and to the buses of the module. As illustrated, tab (108) is a flat wire (e.g. a ribbon wire) with tin plating, which tin plating may be used to form solder connections. The busing (110) is a conductor that is used to interconnect strings of cells, for example at each end, and connect them to external module connections. These may be highly reflective surfaces which may cause a portion of incident light to be redirected back out of the module.

Figure 2:
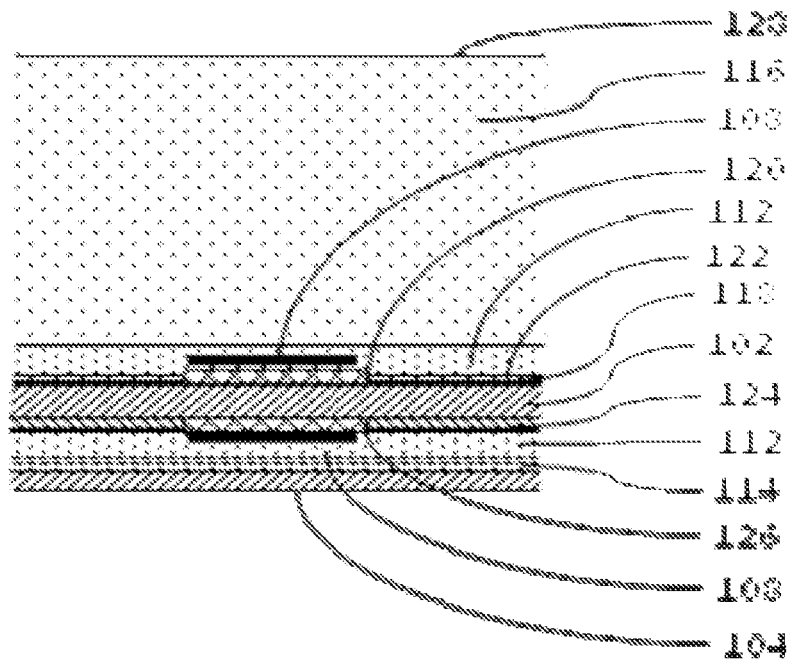
FIG. 2 is an illustration of a module lamination stack, in cross-sectional view.

FIG. 2 is an illustration of a module lamination stack, in cross-sectional view. The illustrated module lamination stack includes cell (102), backsheet (104), tab (108), encapsulant (112), mat (114), glazing (116), front contact fingers (118), front contact (120), anti-reflective surface (122), back surface field (124), back contact (126) and glazing anti-reflective surface (128).

The illustrated cell (102), back sheet (104), and tab (108) are as discussed above with respect to FIG. 1.

Encapsulant (112) is used to bond the various components together. An encapsulant may be introduced as a film or a liquid. The stack of materials is bonded together using the encapsulant, for example in a lamination process. The encapsulant between the cells and the glazing can be selected for its transparency, resistance to yellowing and/or refractive index. The encapsulant which bonds the back sheet may be the same or different material.

Encapsulant (112) may be a translucent material. However, since the encapsulant covers all of the visible area of the module, it may be used to support at least some optical elements used to modify the appearance of a module which may be applied broadly or selectively.

Mat (114) is embedded in the encapsulant (112). The mat (114) can be made of an open weave of translucent fiber. The mat (114) may be used to establish a minimum thickness of material between the back sheet (104) and live electrical connections. In the spaces and margins the mat (114) may also cause reflections to be more diffuse. The mat (114) can be composed of a translucent or opaque fiber. Optically, a mat composed of such fibers makes reflections from the back sheet (104) more diffuse. Since one function of a mat is to act as a spacer, as discussed above, the mat (114) may be composed of colored/patterned material.

Glazing (116) is used to provide a durable surface and electrical isolation through which light may pass to reach the PV cells. Glazing (116) may also act as a substrate on which the PV module is built up and may provide structural support for the cells. Glazing may be used to take advantage of perspective since it is often the thickest layer in the stack.

Glazing is a transparent material, such as glass or acrylic, and may have texture. When glazing (116) is composed of glass, where one or both surfaces, for example the inner surface, can be modified. Since glass can tolerate a high temperature, various high-energy/high-temperature deposition processes may be used. Also, since glass is chemically inert, various chemical process may be used to decorate the glass. If glazing (116) is a polymer material, for example a cast or extruded form, it may be modified with optical elements, for example in ordered or random arrangement.

Front contact fingers (118) are used to collect current from the surface of the cell and conduct it to the front contacts (120). Front contact fingers (118) can be a matrix of conductive material in an array of fine lines that cover most of the active area of the cell and are attached to the cell front contacts (120). They can be metallic with a matte surface.

Front contact fingers (118) can increase the reflectance of the PV module. Because of the size of the lines, front contact fingers (118) may be mostly indistinguishable from any distance.

Front contact (120) is used to make electrical connections to the cell (102) and may be obscured by tab (108).

Anti-reflective surface (122) helps the cell (102) to capture light and helps to trap light that has entered into the cell (102). Capturing and trapping light can make the PV cell appear dark. The anti-reflective surface (122) may affect the optical properties of the module (100).

The back surface field (124) collects current from the back surface of the cell. It may also act as a reflector, causing light that passes through the cell (102) to be reflected internally, possibly many times. The back surface field (124) may be an amorphous metal structure not readily visible from the front of the cell.

The back contact (126) is used to make electrical connections to the cell (102).

The glazing anti-reflective coating (128) may be used to reduce first surface reflections. The coating (128) may be omitted, for example to reduce cost or increase durability. The coating (128) can be a combination of texture, AR coating and/or low refractive index films, such as teflon.

Presence/absence of coating (128) can affect the optical properties of module (100). Texture may be used to modify the visual appearance of the module (100).

Figure 3:
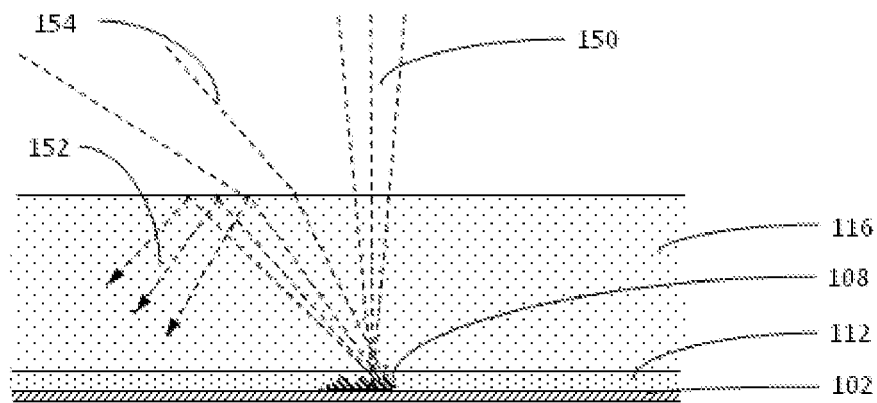
FIG. 3 is a cross-sectional illustration of a solar module.

FIG. 3 is a cross-sectional illustration of a solar module, illustrating internal reflections within the module (100).

Structured or textured surfaces within the module (100), such as features on the surface of a cell or elsewhere, can produce off-axis reflections.

Glazing (116), encapsulant (112), and cell (102) are as discussed above with respect to FIGS. 1 and 2.

As above, the tab (108) is a reflective item, and in FIG. 3 is shown with a vertically structured top surface (i.e. having a shape with vertical features). Other elements with vertical structure could function in a similar manner to the tab (108).

When light is incident on a surface, the surface redirects the light off at an angle predominantly equal to the incident angle. When the incident angle is more than half the critical angle of the glazing (116), light becomes entirely trapped within the glazing (116). Surfaces with lesser slope are able to redirect the light with at least some of it escaping. Surfaces that are positioned so that incident light has a normal angle of incidence are able to redirect the greatest portion of light.

The tab (108) formed from ribbon wire may be used to capture light incident on conductors. As illustrated in FIG. 3, ribbon wire formed with peaks/lands and grooves reflect the incident light at an angle less than half the critical angle of the glazing, with the side-effect that such conductors acquire a dark appearance. Such a dark appearance may make the bright metal conductors less visible. This may be accomplished using, for example, a Light Capturing Ribbon from Ulbrich. However, other methods may be used to accomplish the same thing, such as forming grooves into the tab after the tab has been applied or selectively depositing additional material on top of the tab. Additionally, this treatment may be applied to other reflective surfaces, for example bussing, front contact fingers or backsheet material.

Incoming sunlight (150) is illustrated as having an approximately normal angle of incidence in this example. Sunlight subtends approximately 0.53 degrees of arc. However, in practice diffuse components fill a much larger included angle of up to 15 degrees full-width at half maximum (FWHM). In BIPV applications, the angle of incidence is unlikely to be normal; however, the same principle may be applied for other preferred angles.

Light that has reflected at a substantial angle such that most or all of it is reflected back from the surface of the glazing is shown as trapped light (152). Light that strikes the glazing at or beyond its critical angle (for example, approximately 41.5° for glass) is totally reflected while light near the critical angle is mostly reflected. However, the glazing may have an anti-reflective coating (128) which may increase the critical angle (for example, approximately 48° for glass glazing having a Teflon film).

Light that has reflected from the surface of the glazing at a sufficiently low angle such that it is not entirely trapped is shown as reflected light (154). This reflected light (154) may be observed along some lines-of-sight and is not the same as light reflected from the glazing (116) directly or underlying flat surfaces. It may be observed that the light capturing effect may be used to suppress the bright image of reflective surfaces, but it may also be used to redirect light advantageously for the purpose of changing the visual appearance of the module. The reflective surfaces may further be modified to have a limited spectral reflectance thereby conveying an impression of color.

Figure 4:
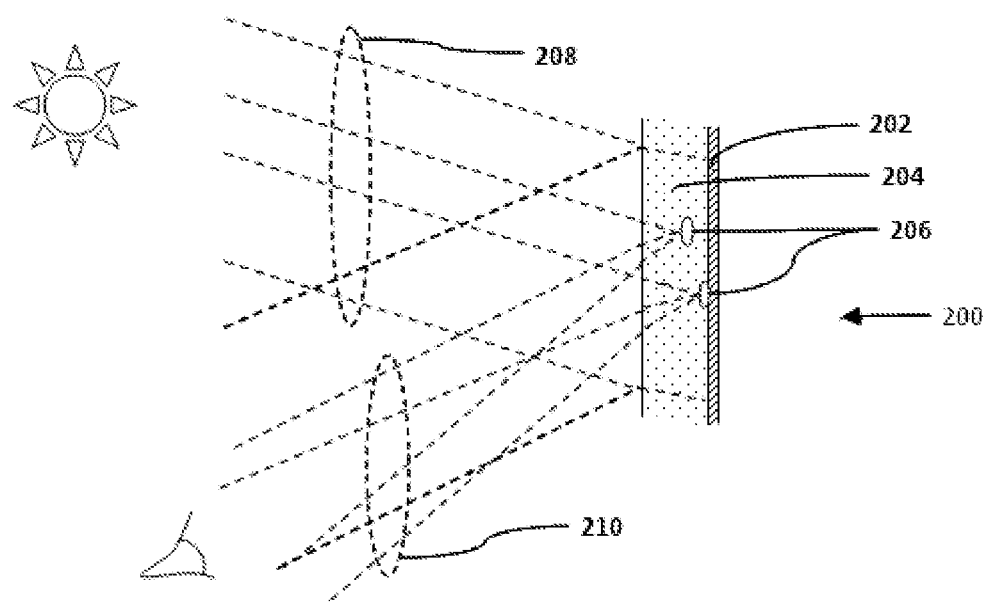
FIG. 4 illustrates a photovoltaic module having modified appearances according to the present application.

FIG. 4 illustrates a BIPV module (200) having modified appearances according to embodiments in the present application. Sunlight impinges on the BIPV module (200), which is positioned in a generally elevated position with respect to an observer. The BIPV module redirects a portion of the sunlight away from the module (200) towards the observer.

The BIPV module (200) includes a PV matrix (202), representing a PV array having cells, interconnections, and other elements as discussed above. The BIPV module (200) further includes transparent layers (204), representing glazing and encapsulating layers in front of the PV matrix (202), as discussed above. The BIPV module (200) further includes optical artifact (206), which diverts incoming, incident light (208) away from the PV matrix (202) and back out of the BIPV module (200) as redirected light (210). Depending on the latitude of building on which the BIPV module (200) is attached, the time of day, the time of the year, and the angle of the BIPV module on the building, the incident light (208) may strike the BIPV module at a variety of different angles. For example, for vertically installed BIPV modules, the incident angle is the latitude plus declination (declination ranges from +23.5° to −23.5° over the course of a year) at noon shifting towards nearly horizontal (approximately +7° due to atmospheric refraction) near the ends of the day.

When BIPV modules are mounted on rooftops, they may be tilted either for best solar gain (i.e. approximately in proportion to latitude) or to meet architectural considerations (i.e. roof slope). Such installation will alter the angular relationships, although the solar module's elevation will remain higher than an observer on the ground.

Given the different sunlight conditions experienced by rooftop and curtain wall installations, BIPV module design may differ between rooftop applications and siding applications.

An observer on the ground will be looking upward, though an observer in adjacent high-rise buildings could be looking upward, downward or across. From the ground in a typical streetscape the redirected light (210) may be reflected at −8 degrees, or more. This angle includes glare (e.g. reflections from the glazing of approximately ~4% for ordinary glazing) and internally redirected light (variable but can be approximately 4-7% for a conventional module) along with whatever is intentionally produced for visual effect. The visual appearance of a module as seen by a typical observer may be modified by introducing optical elements (206) that redirect a portion of the incident light towards the observer. In one example, this redirection is selective in that the majority of the redirected light is directed towards potential points of view. For BIPV, a substantially downwards direction may be preferred.

Figure 5:
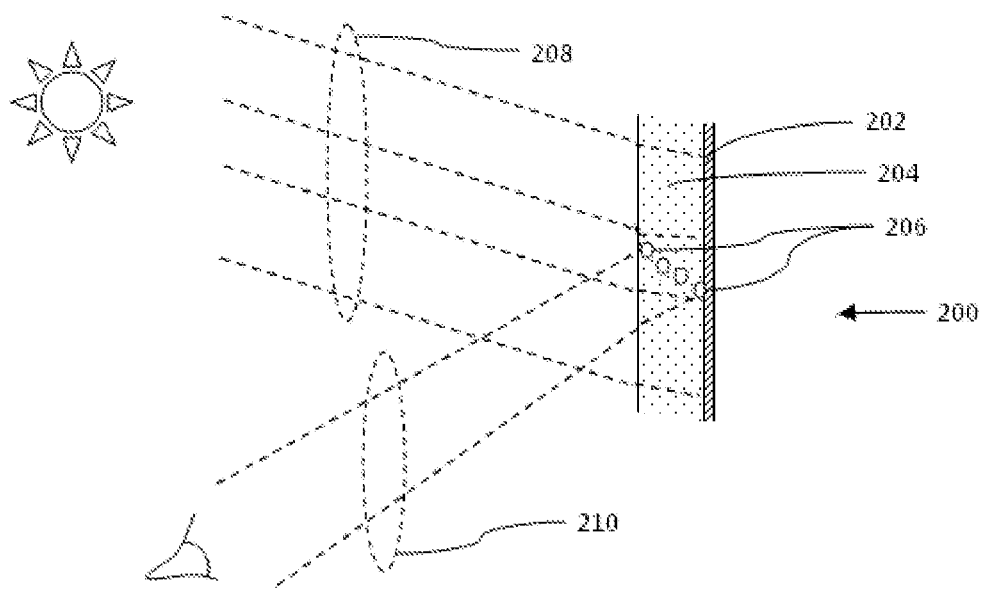
FIG. 5 illustrates a photovoltaic module having a modified appearance through foreshortening.

FIG. 5 illustrates a BIPV module (200) having a modified appearance which is enhanced through foreshortening. The foreshortening effect is accomplished by arranging artifacts in a desired arrangement so that they are primarily disposed in a transverse direction relative to the typical line of sight. The BIPV module (200) includes a PV matrix (202), representing a PV array having cells, interconnections, and other elements as discussed above. The BIPV module (200) further includes transparent layers (204), representing glazing and encapsulating layers in front of the PV matrix (202), as discussed above. The BIPV module (200) further includes optical artifact (206), which diverts incoming, incident light (208) away from the PV matrix (202) and back out of the BIPV module (200) as redirected light (210).

Sunlight impinges on the BIPV module (200) at a generally high angle relative to the observer's line of sight, illustrated as incident light (208). By arranging the optical artifacts (206) in a way that is roughly aligned to the incident light (208) but roughly normal to the observer, say within 20 degrees but preferable 10 degrees, the appearance of the BIPV module (200) may be modified.

In particular embodiments, the optical artifacts (206) may be arranged in a generally linear stripe with, in various embodiments and as illustrated in FIG. 5, some degree of inclination, depending on the intended application. The degree of inclination could be chosen to reduce shadows cast by the artifacts (206) on the PV matrix (202), for at least some preferred angles of incidence.

Artifacts arranged in such a manner may obscure the underlying PV array from the user and/or may create strong lines of color by redirecting light towards the observer. The redirected light is shown as redirected light (210). Additionally, artifacts arranged in such a manner may provide an array of reflectors that redirect light from underlying reflective surfaces (e.g. metal conductors) back to the PV array. Artifacts arranged in such a manner may permit relatively small amounts of material to modify the visual appearance since the arrangement may both obscure the underlying PV array and provide an alternative view to the observer. The coverage from the observer's position is large compared to that from the direction of the sun.

Arranging artifacts in the desired manner is generally more difficult when the glazing is glass in comparison to when the glazing is extruded or sheet cast polymer. Polymer glazing, having reduced weight and increased impact strength in comparison to glass glazing, may be used as a building skin. Alternatively, an additional layer of material, such as a commercial off-the-shelf light control film or similar material, may be incorporated into the glazing and encapsulant stack.

As discussed with respect to FIG. 4, an observer on the ground will be looking upward, though an observer in adjacent high-rise buildings could be looking upward, downward or across. From the ground in a typical streetscape the redirected light (210) may be reflected at −8 degrees, or more. For rooftop installations, not shown, artifacts arranged in the desired manner may result in a more pronounced modified appearance since the PV modules will be inclined either for best solar gain (i.e. approximately in proportion to latitude) or to meet architectural considerations (i.e. roof slope).

Installation of BIPV modules (200) having artifacts arranged in the desired manner may be effective on south-facing roof slopes where direct radiation and/or radiation reflected from PV array surfaces can be diverted towards the observer.

In another embodiment according to the present application, there is provided a PV module having a rear surface of the glazing patterned with a highly reflective material, such as a metallic amalgam or a UV resistant ink or paint. A filigree pattern over the active area of the cells may be used so as to reduce losses. The design choices of patterns may, for example, include patterns that are coordinated with the cell array so that a denser pattern coincides with the more reflective areas (e.g. metal contacts and back sheet) in order to avoid PV losses as well as to suppress reflection from these areas.

UV resistant material may be used to pattern the rear surface of the glazing. UV resistant pigments that may be used include, for example, metal, oxidized metal, metal oxide and mineral formulations which are reflective. For example, titanium oxide is a commonly used white base which is also commonly used as a UV blocker in many applications. Color can be native or interference based. In some cases a transmissive pigment may require a reflective backing which may be provided by a second coat containing a reflective pigment. Advantageously, reflective elements of the solar cell array may also provide the function of a reflective backing behind the decorative coating.

Depending on the UV blocking properties of the glazing, other durable pigments may be used. For example, acrylic or polycarbonate films may be used to increase UV resistance of printed items. In various embodiments, UV resistant pigments may be photoactive. In such embodiments, passivated pigments, such as those produced for outdoor use, may be used if strong UV radiation is expected.

These materials may be used as a powder, a paint, an ink or a paste and more than one material may be used, with consideration for stacking.

Interference pigments may also be used to pattern the rear surface of the glazing, thereby modifying the appearance of the PV module. Interference pigments may have different on-axis and off-axis colors. This effect is emphasized when applied using a liquid medium that affords the pigment an opportunity to stratify before solidifying.

Contemplated pigments used should be chemically compatible with the encapsulant and able to survive the lamination process temperature.

Processes that can be used to apply a pattern to the glazing include: drop-on-demand/ink-jet printing; screen printing/stencilling; roller printing/tampon printing; powder coating; laser sintering, thermal printing; and other printing methods.

Drop-on-Demand/Ink Jet Printing.

Inkjet print heads and micro-jet nozzles have been developed that can handle inks with heavy solids content, for example metallic pigments. For large area sheet printing, a split-axis motion system may be used with print heads arrayed in a roughly linear array with motion predominantly along the length of the array and substrate motion primarily in the transverse direction. Alternatives include mounting the print heads on a multi-axis gantry or robot. Printing in this manner may include a drying/baking process as a secondary operation. Alternatively, UV cure or activated inks can be used. Printing in this manner has the advantage of great versatility and is used for 3-color, 4-color and 6-color printing in commercial processes and large area printers are commercially available.

Screen Printing/Stencilling.

Screen printing and stenciling are similar processes and are used for large format printing. Printing in this manner may use pastes, which can have relatively large and heavy solids content and which may also dry faster than drop-on-demand/ink-jet printing. Drying/baking may also be included as a secondary process. In a single step screen printing, color options are limited although stripes and other mottled effects are possible using multiple inkers. However, the screen printing process may be repeated for successive applications of similar or different material, for example of materials of different colors.

Roller Printing/Tampon Printing.

Roller and tampon printing are similar printing methods which can be used with inks, paints and/or pastes. A thin film of material is dispensed directly onto the raised lands which are than impressed on the substrate, thereby forming a pattern. Alternatively, a thin film is prepared on a platen which is then transferred to the print transfer device. Alternatively, the material is first transferred to a device with raised lands and then the patterned film is picked off and transferred to the substrate. One basic difference is that tampon printing covers an area while the substrate is still, while roller printing covers an area by rolling across the substrate. Roller printing lends itself to a continuous flow process where the roller is static and the substrate is transported. Roller/tampon printing may include a curing, drying or baking post process.

Powder Coating.

Powder coating a surface may be achieved by selectively applying powder. This may be performed by first applying a binder and then dispensing a powder over top the binder, and skimming away excess powder. Alternatively, powder coating a material may be achieved by applying a thin coat of powder and then selectively applying a binder. In the former case, tampon or roller printing might alternatively be used. In the latter case, micro dispensers or masked spray coating may alternatively be used. In either case, a drop-on-demand dispensing system may be used to dispense the binder. This is a variation of drop-on-demand/ink-jet printing described above and permits a greater variety of pigments to be used. Powder coating may also be followed by a drying or baking process and skimming may occur before or after the drying or baking process. Skimmed powder may be recycled. The dispensing process can be repeated several times with, for example, different colors in each pass.

In one example of a layup process, cells are initially face (sun side) up, during which they can be selectively coated, and then turned over for placement onto the layup stack, at which point residues might be easily discarded. This would facilitate coating of the cell array, if desired.

One method of applying powder or paint to metallic surfaces is electro-coating, where the applied material is primarily attracted to metallic electrically energized metal surfaces. This provides a method for preferentially coating tabs and buses in a photovoltaic array using a self-aligning process. Some care may be required to ensure that a harmful potential does not develop across the cells; for example, fixturing the back contacts against conductive equipotential tooling. This method can be particularly effective if applied during the layup of the solar cell array at which point it is typically facing down and the coating material can be drawn upwards against gravity.

Laser sintering is a variation on powder coating where a layer of powder is applied and then fixed by fusing it selectively to the substrate using a laser and then skimming the excess. Laser sintering does not require post processing. The laser can consist of one or more laser heads that can be galvo-scanned, mechanically scanned, mask projected, holographically projected or otherwise distributed into a pattern.

Thermal printing is a method of dry printing where material is transferred by melting a feedstock, and transferring the material to the substrate where it cools and hardens. In thermal printing, the binder may be solid at moderate temperature but fluid at a high temperature and may be, for example, a thermoplastic or thermoset material. Both large area thermal printers and 3-D printers are commercially available. Thermal printers are similar to ink-jet printers but transfer material from a web (ribbon). 3-D printers are similar to drop-on-demand systems but transfer material from a rod or wire. Thermal printing does not require any post processing and may support multi-color printing. Thermal printing may also be compatible with a variety of metallic pigments.

Relatively sparse patterns may be desirable and may have less effect on the overall strength of the lamination. In patterning large areas, such as the exposed back sheet, it may be desirable to additionally or alternatively treat the lamination, such as by using a colored back sheet material. Large printed areas may also be provided with perforations (as opposed to solid fill) or applied in dot-reduced form in order to provide better purchase for the encapsulant.

Processes to apply a pattern to the glazing may be integrated in-line with glass feeding in a typical module assembly line.

Some of the described processes for applying a pattern to the glazing can be applied to the encapsulant instead, where the encapsulant is provided in sheets or on a roll. The advantage may be in combining patterning with intrinsically web compatible processes, e.g. sheet feeding with drop-on-demand, ink-jet or drum printing. Encapsulant sheet may be tacky and slightly porous. Choice of an appropriate medium may result in chemical curing e.g. auto-catalyzed cross linking. Another option is selective powder coating using a heated powder that would fuse directly to the encapsulant film. One advantage is that this type of dispenser is highly tolerant of metal and mineral powders and flakes.

In yet another embodiment according to the present application, there is provided a PV module having a rear surface of the glazing patterned with a highly reflective material, where the patterning includes structuring with depth in order to tilt the plane of the optical material in one or two dimensions and allow the reflected light to coincide with the typical line of sight.

Methods for patterning the glazing with structured depth may include, for example, forming facets into the glazing or adding facets to the surface of the glazing prior to applying pigmented material. These facets may be impressed into the glazing prior to manufacture or added as part of the manufacturing process.

Materials and processes for patterning the glazing with structured depth are generally as described above. The desired texture may be formed directly into or onto the glazing. Alternatively, texture may be added during a deposition/printing process by applying a translucent material (for example, ink/paste/paint) as a first coat. Alternatively, a formed polymer sheet may be added to the lamination stack.

Acrylic or silicone materials are particularly suitable for additive approaches as they have desirable optical and UV resistance properties and are available in a number of formulations and may be applied as a liquid or liquid in medium (e.g. paint) and are fast drying or UV curable.

Processes for texturing the glazing may use bespoke material designed for a specific application. Common patterning methods include, for example: (hot) roll forming, surface casting, and hot stamping. In processes that pattern the glazing with structured depth, the manufacturing process would generally be similar to the example discussed above. The process could include custom glazing or glazing with a fine linear or lenticular pattern, which is commercially available. The process adds no additional process steps to the module assembly process if pre-textured/pre-patterned glazing is used.

An alternative means of patterning the glazing includes forming a negative into the surface. The glazing can be selectively removed using turning (e.g. diamond turning in glass), grit-blasting or etching, or heat stamping in the case of polymer glazing. If desired, the contoured surfaces may be produced with fine texture or polish which may require a secondary operation. Patterning the glazing in this manner adds process steps to the module manufacturing process, but may use commodity glazing materials.

Another alternative means of patterning the glazing is to form a positive on the surface by selectively adding a transparent material. A number of printing methods, as described in the previous examples, could be used to accomplish this. Printing methods which deliver larger volumes of materials are generally more effective than printing methods which delivery smaller volumes of materials. Multiple application and curing passes may be utilized to develop a 3-D profile. With materials in a moderate range of viscosities, a sloped surface may be developed by simply inclining the glazing during the curing process. Patterning the glazing by forming a positive on the surface adds process steps to the module manufacturing process, but may use commodity glazing materials. It may be desirable if the same process may be used to apply texture and colorant in successive steps.

Figure 9:
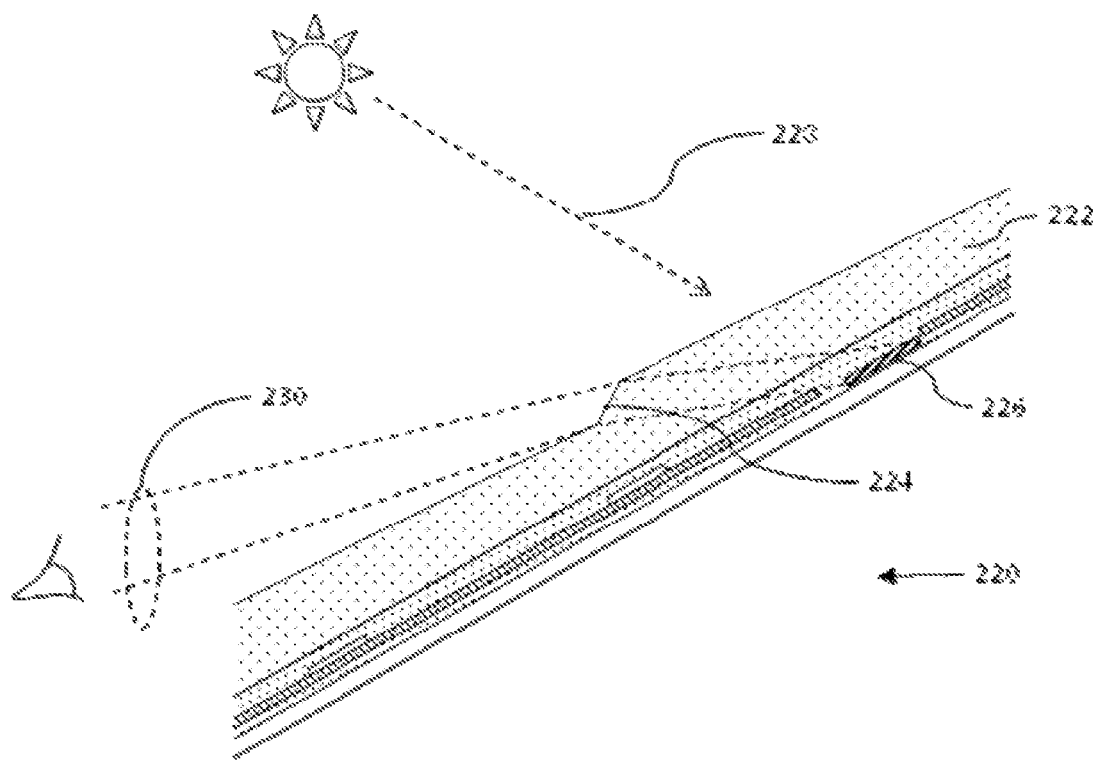
FIG. 9 depicts an exemplary module configuration wherein textured surfaces are used to modify the visual appearance of a photovoltaic module.

FIG. 9. illustrates one particular embodiment where a BIPV module (220), of which a small segment is shown in cross section, has a modified visual appearance. As illustrated, the modified appearance is provided by a facet (224) formed into the glazing (222) in combination with an encapsulated element (226). The facet (224) modifies the visibility of the embedded element (226) by refracting light reflecting off of the element (226) towards the observer (230). The embedded element (226) is placed in a photovoltaically inactive area, for example over an exposed portion of the backsheet between cells or metal interconnects of cells. The embedded element (226) is colored and textured in such a way as to redirect incident light (228) substantially towards the facet (224). The facet (224) and element (226) may be physically aligned to provide an enhanced modifying effect for some particular viewing angles. The facet (224) may be substantially flat, or may alternatively, or additionally, be concave in order to increase the range of viewing angles through which element (226) is visible to an observer. The embedded element (226) may be textured so as to redirect a substantial portion of incident light (228) towards the facet for a particular range of angles of incident light (228). It may further be observed that incident light (228) is refracted by the facet (224) creating a shadow which may be advantageously aligned to another photovoltaically inactive portion of the cell matrix. As shown, the PV module could be a roofing or awning element with the appearance modifying features optimized for a specific range of latitudes and roof slopes. Many additional facets may be formed into the glazing (222) where only a fraction of the facets (224) are aligned to embedded elements (226) or where different facets may enhance the visibility of embedded elements for different viewing angles.

Colorant may be added selectively using any of the methods suggested in the previous example; however, it is desirable to provide a means to coordinate this operation with the surface contours, such as using, for example, machine vision guidance.

Surface contours may be positive, negative or complex and may be substantially planar, concave, convex or complex. A portion of this contoured surface may be coated with the desired colorant(s). Surface inclination may be used to alter the path of reflected light, while variations in inclination may be used to control the degree of collimation. Uncoated portions of a contour may have little effect on the efficiency of the module since the closely matched refractive index of the encapsulant will result in reduced refractive bending of the light which is not reflected.

In a further embodiment according to the present application, there is provided a PV module having a luminescent dye to provide color to the PV module. In such a PV module, an observer sees an indirect redirection of incident light. Use of a luminescent dye may have a limited impact on efficiency of the PV module by utilizing light energy that is of little value for PV based on spectral sensitivity.

Luminescent dye may be applied to the back of the glazing/front of the encapsulant, embedded in the glazing material or applied to the glazing.

In a PV module having a luminescent dye, visible luminescence is either emitted towards the observer (thereby modifying the appearance of the PV module), towards the module where it may be absorbed by PV cells (thereby possibly resulting in a higher net efficiency, depending on the spectral sensitivity of the cells), or captured and redirected towards the cells by total internal reflection.

Using luminescent dyes may be particularly suitable to night-time illumination using edge lighting, e.g. with short wavelength LED strips.

A variety of photoluminescent materials may be used. Since the photoluminescent material may be applied sparsely, it could be in the form of an ink or a powder. In one embodiment, a uniform thin coating could be used, which could also serve a secondary function as a UV blocker for the encapsulant, thereby possibly reducing the cost of the encapsulant or reducing its rate of aging. The photoluminescent material could be applied uniformly or in a pattern. Additionally, materials with different luminescence spectra could be used to produce multi-color effects.

Aside from luminescent materials, any material that has strong absorption at wavelengths at which the PV cells have limited or no spectral response, while efficiently emitting at a relatively well defined wavelength thereby producing a specific color, or while having a broad spectrum white or pastel emission may also be used. One example of such a material is quantum dots, which may be used as wavelength converters. Several different materials may be combined to produce various graphical effects and extend the color palette.

The choice of material may depend on the desired application. First, it is desirable for strong absorption to be at wavelengths that pass through the glass (which may possibly exclude some UV absorbers). For a-Si TF and mc-Si conventional cells, which have rather poor blue response, a blue absorber (for example, such as is used in the manufacture of 'white' LEDs) could be utilized. For chalcopyrite cells, some blue light must be absorbed in order to prime the CdS barrier layer so a blue absorber may not be appropriate. For CdTe cells in particular, absorbers that are able to up-convert from near infra-red (NIR) wavelengths would be advantageous.

Commercially available fluorescent powders used for light conversion in lighting applications may be used. Some commercially available fluorescent powers are very strongly colored for displays, signage, traffic lights and similar applications. Other applications for commercially available fluorescent powders include sign printing, graphic arts, paint brighteners, etc. Available colors span the entire spectrum. Commercially available fluorescent powder may be more effective in reflection than transmission. Powders can be combined without drying or binding. Since some of these powders are bonded to glass at relatively high temperature, they might be thermally bonded to an encapsulant film by the simple expedient of heating it during application. Some UV sensitive (i.e. down converter) powders and NIR sensitive (i.e. up converter) powders are commercially available and many of these can be formulated into a paint or ink as a pigment if needed.

Fluorescent dyes (or more specifically fluorophores) may include quantum dots and small organic molecules with particular chemistries (for example aromatic or conjugated compounds). At least 10 families of such compounds are commonly used. These materials can be used to color an ink. Fluorophores may provide greater transparency (i.e. less blocking of unabsorbed light) than pigments.

Alternatively, a fluorescent glazing could be used. For example, tin fluorescence may be used in glass production. It has been shown that adding sensitizers such as iron oxides, cerium oxides, etc. can be used to enhance fluorescence of soda lime glass. The resulting emission is a broad white or pastel emission. Soda lime glass with added sensitizers may have, for example, a strong absorption at ~365 nm but may otherwise be as transparent as ordinary soda lime glass. In one example, $SiO_2$ is sensitized using Eu and at least one of Y, Gd and La to produce monochromatic emissions at visible wavelengths, for example red emissions. Alternatively, fluorescent glass of this type may be provided in the form of glass beads or glass frit. This is advantageous since the glazing may be conventional glass or solar glass and the resulting coloration can be uniform or patterned. In one embodiment, a thin layer of this material is applied to the glass and fired into the glass. In another embodiment, this material is integrated into the encapsulant.

Still other rare earth compounds may be used as sensitizers for heavy metal oxides and are capable of producing an up-conversion (i.e. visible light from infrared). In one example, $Bi_2O_3$ is used with at least one of Ce, Pr and Nd. While different heavy metals may be used, Bi exhibits relatively low toxicity.

Various formulations employing relatively inexpensive metallic compounds may be used to produce fluorescent glazing and tile.

Using fluorescent glass results in no impact on the module assembly process other than for the specialization of the glass material. If fluorescent materials are applied, they may be applied to the glazing or the encapsulant using some of the methods described in the example described above.

Depending on whether fluorescent material is selectively or uniformly applied, the intensity of coloration may be affected i.e. sparse patterns can achieve the greatest local intensity for a given amount of efficiency loss, if any.

In some cases, it may be desirable to use fluorescent or luminescent dyes to modify the appearance of a PV module so as to result in a visible appearance with a broad angular distribution. However, in other cases, reflective pigments with a potentially narrower viewing angle but possibly greater intensity might be preferable, for example pigments in the form of flakes. However, it may be advantageous to use fluorescent or luminescent dyes to modify the appearance of a PV module where incident light absorbed has limited PV potential and/or luminescence trapped in the module has good PV potential, since up conversion and down conversion are sought-after means of improving PV module performance. Advantageously, photoluminescent material consumes incident light at wavelengths that have little or no PV potential and emits visible light which may be partially usefully absorbed by PV cells. Consequently, even when applied over photoactive areas, the PV efficiency may be only slightly reduced or even improved.

Figure 10:
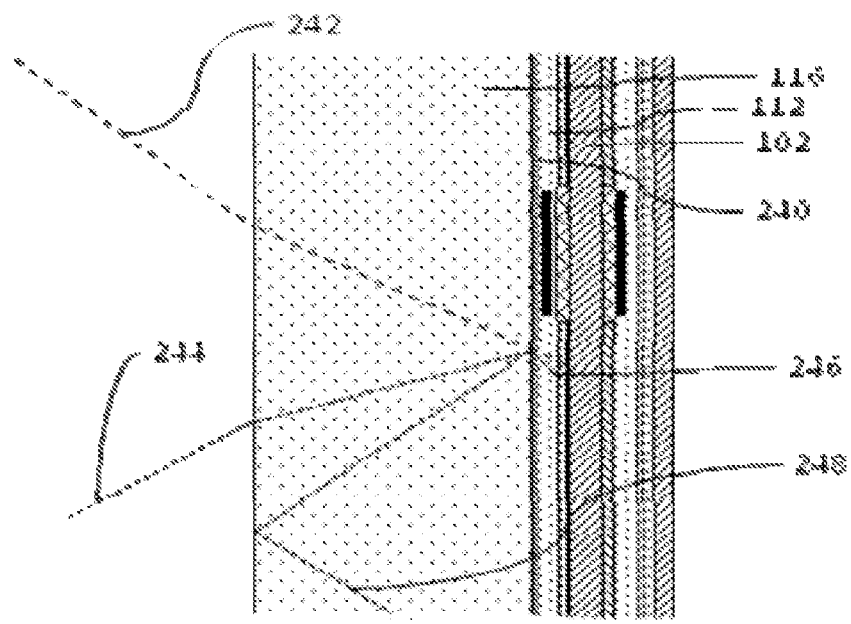
FIG. 10 depicts an exemplary module configuration wherein photoluminescent material is used to modify the visual appearance of a photovoltaic module.

FIG. 10 illustrates an exemplary embodiment of a PV module similar to that illustrated in FIG. 1 and FIG. 2. In the embodiment illustrated in FIG. 10, a photoluminescent material (240) is embedded behind the glazing (116) in encapsulant (112). The photolumescent material (240) absorbs a portion of incident light (242), while the remainder of the incident light impinges on cells (102) in the array of cells, as in normal operation. A portion of the visible light emitted by the photoluminescent material (244) is directed out of the PV module creating a modified visual appearance. Another portion of the visible light emitted by the photoluminescent material (246) may be directed towards the cells (102) in the array of cells, potentially generating additional photocurrent. Another portion of the visible light emitted by the photoluminescent material (248) may be captured by total internal reflection and directed towards the cells (102) in the array of cells, potentially generating additional photocurrent. The photoluminescent material (240) may be applied to the glazing (116) or the encapsulant (112) during or prior to the layup process. In a particular embodiment, the photoluminescent material may be in the form of glass beads which have been printed onto an encapsulant film and fixed in place by a brief application of radiant heat.

In yet another embodiment according to the present application there is provided a PV module having a light control film to modify the appearance of the PV module. A light control film comprises a transparent sheet material which incorporates inclusions which may be structured and oriented such that it is relatively transparent to light in certain directions and relatively opaque in others. One example of this property is a venetian blind. Commercially available light control films may incorporate strands of colored or opaque material oriented approximately at right angles to the transparent direction. Since inclusions are thin (for example striations or flakes), their visible cross-section depends on the viewing angle.

In embodiments which use light control films, similar films can be used although greater versatility in the distribution of inclusions may be desirable where a variegated visual appearance is desirable. Inclusions might also be distributed non-uniformly, for example so that they can be coordinated with optical features in the cell array.

Light control films may be provided as a film that can be incorporated into the lamination stack. Alternatively, light control film may be applied as an overlam where the low refractive index of the bulk material serves a second purpose of reducing glare, improving the oblique visibility of the inclusions, and/or reducing the optical losses of the PV module.

Light control film may be a transparent film in which inclusions have been incorporated in a structured manner. Inclusions may be opaque and dark, blocking off-axis viewing. Inclusions may be opaque but reflective and neutral, i.e. silver or white, or colored; in which case, visual appearance is the result of diffuse ambient light plus whatever light is reflected from underlying material. Inclusions may also be translucent, in which case at least some of the visual appearance is due to back-lighting by the primary incident light (direct sunlight).

Light control film may be supplied as an extruded polymer film with inclusions coextruded into the film. Commercial products range from linear patterns, normal or inclined to the surface, and honeycomb patterns depending on whether preferred incidence angles are distributed in one or two dimensions.

Decorative glass may also be produced by extrusion in a similar manner.

Desirable materials for light control films may include variations in the color and inclusions which can be readily obtained by modulating the injectors in an extrusion process. Alternatively, the light control film may be produced with a pattern of fine grooves which are selectively filled. Fillers may include colored and transparent components.

If this film is applied as an overlam, it may further improve the performance of the PV module if the refractive index of the film is significantly lower than that of the glazing. It may further be coated with a scratch resistant UV resistant film, e.g. Teflon, possibly with a lower refractive index, thereby further improving the esthetic performance of this film as well as the PV performance.

Light control film may be provided with encapsulant/adhesive already applied to one or both surfaces.

The light control film may also serve as a vector for other methods discussed in previous examples. For example, it can be patterned on one or both surfaces, contoured, and coated or impregnated with photoluminescent material. All of these methods are compatible with extrusion and web handling processes. For example, photoluminescent materials can be coextruded in bulk or as a skin. Also, coextrusion or hot marking of patterns on sheet material may be used. Converters can further perform the required operations in a sheet finishing process.

Use of light control films may include additional lamination processing depending on where the film is inserted into the lamination stack. In the simplest cases, the film is inserted in front of or behind the glazing along with an additional encapsulant/adhesive material (if needed), thereby adding additional sheeting steps to the layup process with lamination proceeding in a similar fashion to lamination of conventional modules.

Alternatively, light control film may be supplied with encapsulant/adhesive films on both sides in which case it can be applied by using the same sheeter that would be used to supply film encapsulant in the conventional process. That is, no new equipment or process steps would be needed. Alternatively, lamination may be done as a separate process step.

Alternatively, module glazing and light-control film may be one and the same. This is particularly desirable where polymer glazing is used since it has no impact on the module manufacturing process.

Using light control film has minimal impact on the module assembly process as the structuring of the film may be outsourced to a converter and the use of light control film is flexible and optional. Further, the film can be applied to completed laminations or to finished product so that product characterization can be accomplished at the very end of the process.

Using light control film may be desirable in roofing and awning applications where modules are mounted on an incline and typical viewing angles are oblique.

In one variation, films can be applied at point of use, for example to achieve a large area/bill-board effect. Films may also be made peelable if it is desirable to repeatedly modify the appearance.

The embodiments described above apply to PV module construction where finished cells are laid up on glazing. In yet another embodiment according to the present application there is provided a PV module having CIGS (copper indium gallium selenide) modules laid up on a metal back contact. In PV modules having CIGS cells deposited on a monolithic backsheet, a secondary glazing film is bonded to the top surface of the glazing to provide a glazing substrate and encapsulant interface for the CIGS modules.

Adding CIGS modules can be applied to any type of PV module, for example thin film modules, even in a finished or nearly finished form. This may provide an opportunity to concurrently improve module efficiency.

Various transparent materials may be applied as an overlam. Certain polymer films, such as, for example, acrylic, polycarbonate, urethane, silicone or Teflon materials could be used because:
  their flexibility may enable the use of web processing methods;
  they may have high UV resistance and may also provide UV blocking, which could permit lower cost glazing and encapsulant to be used;
  their low refractive index, which reduces first surface and total reflection from the module, may increase efficiency;
  their low refractive index may also reduce gloss but may increases the critical angle of the glazing, thereby increasing the contrast and visibility of underlying appearance features;
  their general resistance to dirt and blocking of ion migration (if the underlying glazing is glass) may result in a lower maintenance surface.

More generally, the approach of applying additional layers to the front of a module laminate subassembly has the advantage that conventionally produced laminate subassemblies can be upgraded by some additional post processing, which can be an optional step in factory workflow. This approach may also be advantageous in that the requirements of producing a functional PV module may impose fewer constraints on achieving the decorative aspect. Additionally, if this additional treatment has significant cost, it can be delayed until the laminate subassembly has undergone a functional test, reducing the value add in scrap items.

Scratch resistance may makes certain materials, such as Teflon, desirable. Teflon may be used to protect acrylic glazing or certain urethanes that are self-healing. Alternatively, a scratch protecting film may be a component of the overlam.

Additional rigid glazing, which could be the same as the main glazing, may alternatively be used. This may not be an issue for architectural applications where a thicker glazing or safety glazing may be desirable to meet a building code requirement. With the use of a suitable encapsulant, a double layup of glazing becomes the equivalent of "safety glass". Furthermore, this double layup of glazing could replace the rigid (glass) back-sheet, which may be used in thin film modules as a structural component, with an alternative thinner/lighter backsheet being used.

One desirable choice of materials (i.e. an optional scratch film, overlam, and encapsulant/adhesive) is the one where the refractive index of the materials follows a geometric progression between 1 and the refractive index of the module substrate (for example, glass). Commercially available scratch resistant films may have refractive indexes in the range of 1.2 to 1.3. Using such commercially available films would result in an overlam with an index near 1.33 and an encapsulant/adhesive near 1.43 being desirable. This provides the advantage of at least partially offsetting the added cost of this amendment by means of increased module efficiency.

The overlam may be shaped and patterned using the various methods previously described. If a flexible material is used, roll-to-roll processes may be used to prepare the material offline, for example outsourcing this operation to a conventional converter or printer. Alternatively, a flexible foil may be prepared using a web-based sheeting process.

Bonding of the overlam could be done in a conventional process flow during module lamination, which would have a reduced impact on a module assembly process. Alternatively, bonding could be done as a separate process. In the event that a considerable glazing thickness is required to meet building code requirements, a secondary operation may be preferable since the additional thermal mass could slow down and adversely bias the module lamination process.

In an integrated process, prepared overlams may be placed first onto the layup table; secondly, an encapsulant may be applied; and then the conventional layup process may proceed with the deeper stack placed into a laminator. This approach adds an additional feeding and encapsulant sheeting or dispensing process.

Alternatively, module laminates may be produced normally and then routed through a second laminating or bonding process.

Using overlams to modify PV modules is an extension of the other examples described above. Using overlams may enable the use of various options to improve appearance with thin film modules of the type where deposition is applied to the front glazing, which options would preclude the use of many of the methods described.

Using overlams may be applied as a secondary process to module laminates as an adjunct to a conventional module manufacturing line without impacting the process flow of conventional module manufacturing or precluding the manufacture of conventional modules or mixed production.

In this case, if a relatively low refractive index material is used, the overall optical efficiency of the module may be raised by up to 4%, since lower refractive index means lower reflection and bare glass has approximately 4% reflection on axis and higher off axis which may offset the optical losses due to the addition of decorative features. As well it can improve the apparent contrast of these features.

It should be noted that this double layer construction can be beneficial when used in thin film manufacturing where the deposition process requires a temperature tolerant substrate (such as glass), not only because of the optical gains, but because:

the thermal mass in the deposition chambers is reduced,
the scrappage cost may be reduced,
the final weight of the architectural panel may be reduced if the overlam is a lighter material, and
the resulting assembly may be equivalent to safety glass.

Thin film modules may be produced using a glass-glass configuration, for example out of concern for moisture resistance. In a curtain wall application, this is less of a concern and the second layer of glazing may be moved to the front and be replaced by a more conventional polymer back-sheet.

Thin film cells may be long and thin, which may dictate a different graphical arrangement than in conventional cells (i.e. PV modules where finished cells are laid up on glazing). When deposited directly on the glazing, metal contacts may not be seen (being on the back side of the cells) and the backsheet, if any, may also not be seen.

It may be observed that a plurality of methods for modifying the visual appearance of a PV module as described above may be applied in any combination.

Figure 6:
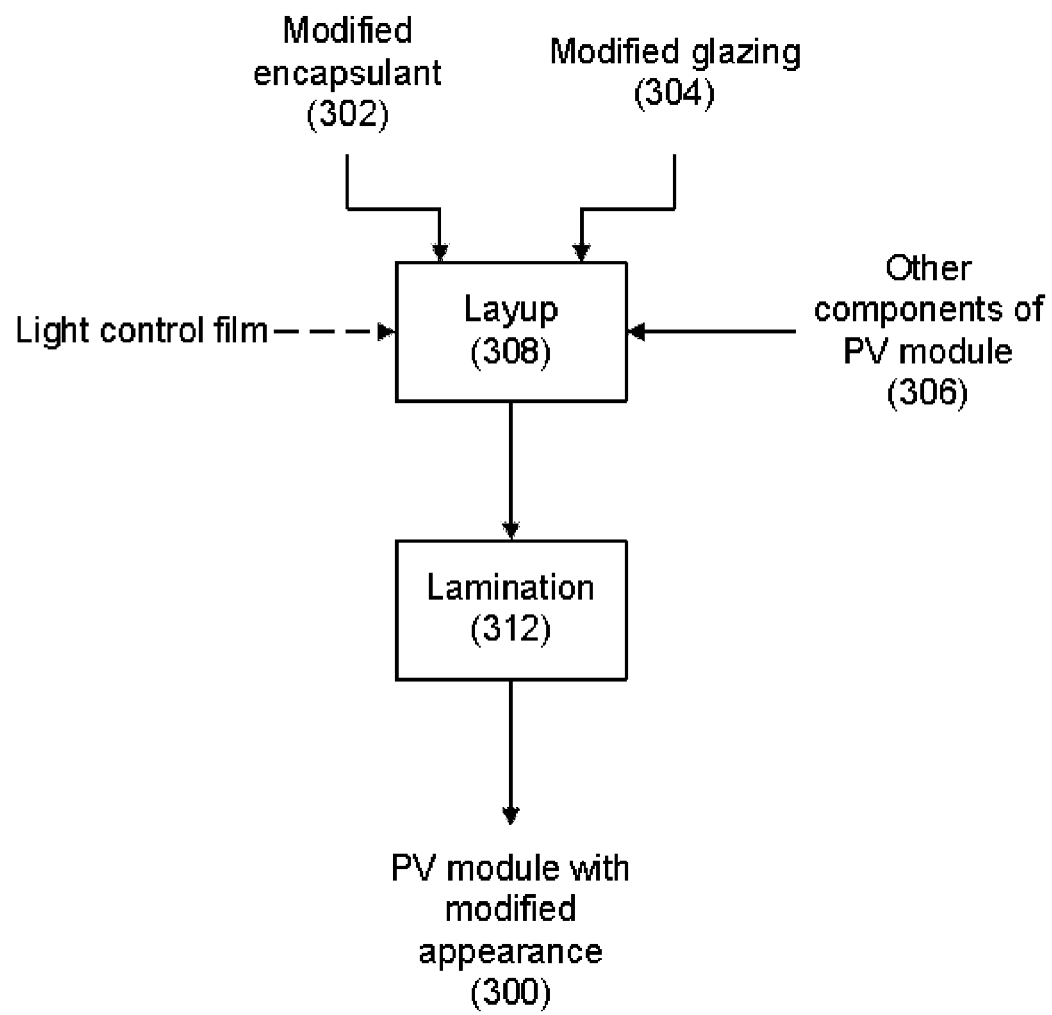
FIG. 6 depicts an exemplary process for producing a photovoltatic module with modified appearance.

FIG. 6 depicts an exemplary process for producing a PV module with modified appearance (300). Modified encapsulant (302), modified glazing (304) and other components of a PV module (306) are stacked in layup step (308). Optionally, other components (306) comprising an array of cells with interconnections may be modified prior to or during the layup process. Optionally, light control film (310) could also be included in the stack. In the event that there is a distinct pattern or distribution which must be aligned, the layup process may include alignment steps to ensure that the desired pattern registration is achieved. The stacked materials are laminated together in lamination step (312) to produce PV module (300).

Figure 7:
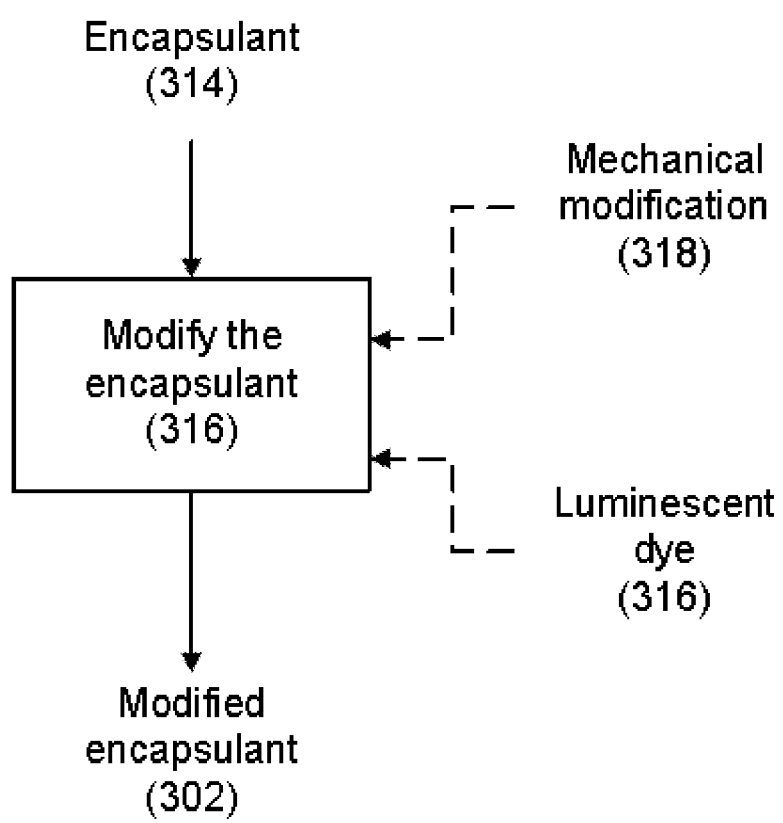
FIG. 7 depicts an exemplary process for producing modified encapsulant.

FIG. 7 depicts an exemplary process for producing the modified encapsulant (302). Encapsulant (314) may be modified in modification step (316) to produce the modified encapsulant (302). The encapsulant (314) may be treated with a luminescent dye (316) and/or mechanically modified (318), for example by forming a negative into or a positive onto the surface of the encapsulant.

Figure 8:
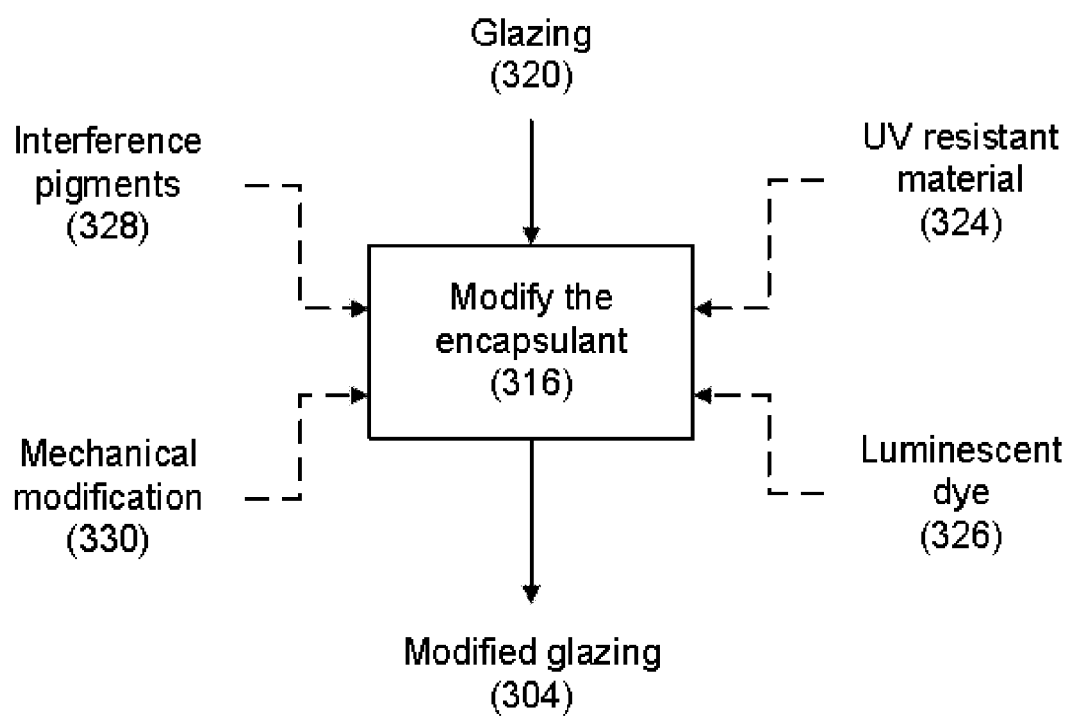
FIG. 8 depicts an exemplary process for producing modified glazing.

FIG. 8 depicts an exemplary process for producing the modified glazing (304). Glazing (320) may be modified in modification step (322) to produce the modified glazing (304). The glazing (320) may be treated with a UV resistant material (324), a luminescent dye (326), an interference pigment (328) and/or mechanically modified (330), for example by forming a negative into or a positive onto the surface of the glazing.

Other methods of modifying the encapsulant (314) and/or glazing (320) are discussed earlier and could additionally or alternatively be used in the exemplary processes depicted in FIGS. 7 and 8.

The embodiments herein have been disclosed with a certain degree of particularity for the purpose of description but not of limitation. Those skilled in the art will appreciate that numerous modifications and variations can be made to the embodiments without departing from the spirit and scope of the application.

Embodiments of the disclosure, such as control systems related to the methods and control of assembly lines the like, can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

While the above description provides examples of one or more processes or apparatuses, it will be appreciated that other processes or apparatuses may be within the scope of the disclosure. It will also be understood that the processes and apparatuses may be implemented using hardware or software components or an appropriate combination thereof. Software may be provided as instructions on a physical computer medium or the like for execution on a processor of a computing device.

What is claimed is:

1. A coloured colored photovoltaic (PV) module comprising:
a photovoltaic cell; and
an appearance modifying system that interacts with at least a portion of the incident light on the photovoltaic cell to cause a modified visual appearance to an observer, wherein the appearance modifying system spatially demultiplexes incident light to provide a power-creating component and an appearance-modifying component and wherein the appearance-modifying component is substantially directed to the observer, the appearance modifying component comprising a plurality of facets provided to a glazing and embedded elements provided to photovoltaically inactive areas, wherein the spatially demultiplexing comprises configuring the facets and embedded elements such that the facets refract light reflecting off the embedded elements substantially toward the observer.

2. The colored photovoltaic module according to claim 1 wherein the appearance modifying system further comprises a film, encapsulant or glazing.

3. The colored photovoltaic module according to claim 2 wherein the film, encapsulant, or glazing comprises a pattern configured to provide further spatial demultiplexing.

4. The colored photovoltaic module according to claim 1 wherein the appearance modifying system further comprises: a light-control film; graphic material; a phosphor; a dichroic film; nano-particles; micro-dots; metal flakes; paint; an additive material for 3-D printing, Selective Laser Augmentation (SLA) or Selective Laser Sintering (SLS); or any combination thereof.

5. The colored photovoltaic module according to claim 1 wherein the appearance modifying system further modifies the reflection, photoluminescence, scattering, perspective, optical properties, or any combination thereof of the photovoltaic cell.

6. The colored photovoltaic module according to claim 5 wherein modifying the photoluminescence comprises modifying the fluorescence, phosphorescence, quantum conversion, or any combination thereof of the photovoltaic cell.

7. The colored photovoltaic module of claim 6, wherein a portion of the light produced by the photoluminescent material is absorbed by the photovoltaic cell, thereby increasing module efficiency through photon conversion.

8. The colored photovoltaic module of claim 1, wherein the appearance modifying system is further configured to spatially align with photovoltaically inactive portions of the photovoltaic module.

9. The colored photovoltaic module of claim 1, wherein the appearance-modifying system substantially directs the appearance-modifying component in one or more relatively narrow spectral bands generally aligned to the peak spectral responses of human vision receptors.

10. The colored photovoltaic module of claim 1, wherein the spatial demultiplexing comprises aligning the embedded element to the incident light but approximately normal to the observer.

* * * * *